| United States Patent [19] | [11] Patent Number: 4,775,796 |
|---|---|
| Purser et al. | [45] Date of Patent: Oct. 4, 1988 |

[54] TREATING WORKPIECES WITH BEAMS

[76] Inventors: Kenneth H. Purser, 9 Hickory Hill, Manchester, Mass. 01944; Norman L. Turner, 44 Riverview, Gloucester, Mass. 01930

[21] Appl. No.: 703

[22] Filed: Jan. 6, 1987

[51] Int. Cl.⁴ .................. G01N 23/00; A61K 27/02
[52] U.S. Cl. ........................ 250/492.2; 250/397
[58] Field of Search .................. 250/492.21, 397, 398

[56] References Cited

U.S. PATENT DOCUMENTS

| 3,778,626 | 12/1923 | Robertson | 250/492.21 |
|---|---|---|---|
| 4,021,675 | 5/1927 | Shifrim | 250/492.21 |
| 4,517,465 | 5/1985 | Gault | 250/492.21 |

FOREIGN PATENT DOCUMENTS 0071546  4/1983  Japan ..................... 250/492.21

*Primary Examiner*—Bruce C. Anderson
*Attorney, Agent, or Firm*—Henry C. Nields

[57] ABSTRACT

A dose monitoring system for ion implantation devices which employ a moving support element such as a spinning support disk which is moved through an ion beam by a scan motion uses a pick-up plate on the spinning support disk to measure incremental dose and to generate a signal which is used to vary the scan motion of the spinning support disk in order to control dosage.

3 Claims, 3 Drawing Sheets

TREATING WORKPIECES WITH BEAMS

BACKGROUND OF THE INVENTION

1. Field of the Invention

This invention relates to treating workpieces with beams and particularly to implanting ions in semiconductor wafers.

2. Description of the Prior Art

In ion implantation and other processes in which a beam of particles or radiation is directed at a workpiece, the beam must generally be moved across the workpiece in a controlled manner to spread the particle or radiation dosage evenly across the workpiece. In doping semiconductor wafers, a common technique is to move the wafers relative to a fixed beam along two orthogonal directions. The wafers are supported on a moving surface, which moves them at high speed along one direction and at a lower speed along an orthogonal direction. To achieve uniform doping density, it is conventional to measure the beam intensity, and vary the control speed accordingly, increasing the control speed when the intensity of the beam on the wafers increases and decreasing the speed when it decreases.

In the prior art, beam intensity has been detected in various ways summarized in U.S. Pat. No. 4,234,797 to Ryding.

SUMMARY OF THE INVENTION

The present invention is an alternative to the dose measuring system disclosed in said U.S. Pat. No. 4,234,797 to Ryding. Said patent discloses apparatus for controlling the treatment of workpieces by a beam emanating from a source, wherein the workpieces are supported on a support which is moved through the beam. The movement of the support is relatively rapid in one dimension, and relatively slow in the dimension orthogonal thereto. In one embodiment disclosed in said patent the workpieces are supported on a spinning disk, the rotation of which moves the workpieces in what is designated by Ryding as a "scanning" direction. Slow movement orthogonal to the scanning direction is imparted to the spinning disk in what is designated by Ryding as a "control" direction. Non-uniformity of dose is caused, not only by random variations in irradiation conditions, but also by the simple fact that areas of the workpieces which are near the axis of rotation of the disk move more slowly through the beam than areas near the periphery of the disk, so that the dose delivered per revolution of the disk is higher for areas near the axis than for areas remote therefrom. In the Ryding patent a radial slot is provided in the disk, and a stationary Faraday cage is supported behind the spinning disk. The width of the slot is constant, so that the current measured by the Faraday cage is a measure of the relative dose rate. Thus, for example, higher readings will be observed when the beam is near the axis of the spinning disk than when the beam is remote therefrom, inversely proportional to the radius.

In accordance with the present invention the stationary Faraday cup of the Ryding patent is replaced by a pick-up mounted on the spinning disk. A suppression electrode surrounds the pick-up plate except for the area of ingress of the beam, and a suitable voltage, such as −300 volts, is applied to the suppression electrode with respect to the plate. A pick-up wire from the pick-up plate, and a bias wire from the suppression electrode, are connected to their respective electrodes, and are mounted within the axle of the spinning disk, extending to the outer end thereof at atmospheric pressure. Slip-rings with brushes provide electrical connection to these wires, so that a bias voltage may be applied to the suppression electrode and the current received by the pick-up electrode may be measured.

By using a parallel sided pick-up plate, compensation for the change in beam position along the radius and thus correspondingly changing the position of the disk is accomplished.

DESCRIPTION OF THE PREFERRED EMBODIMENTS

Figures 1, 2:
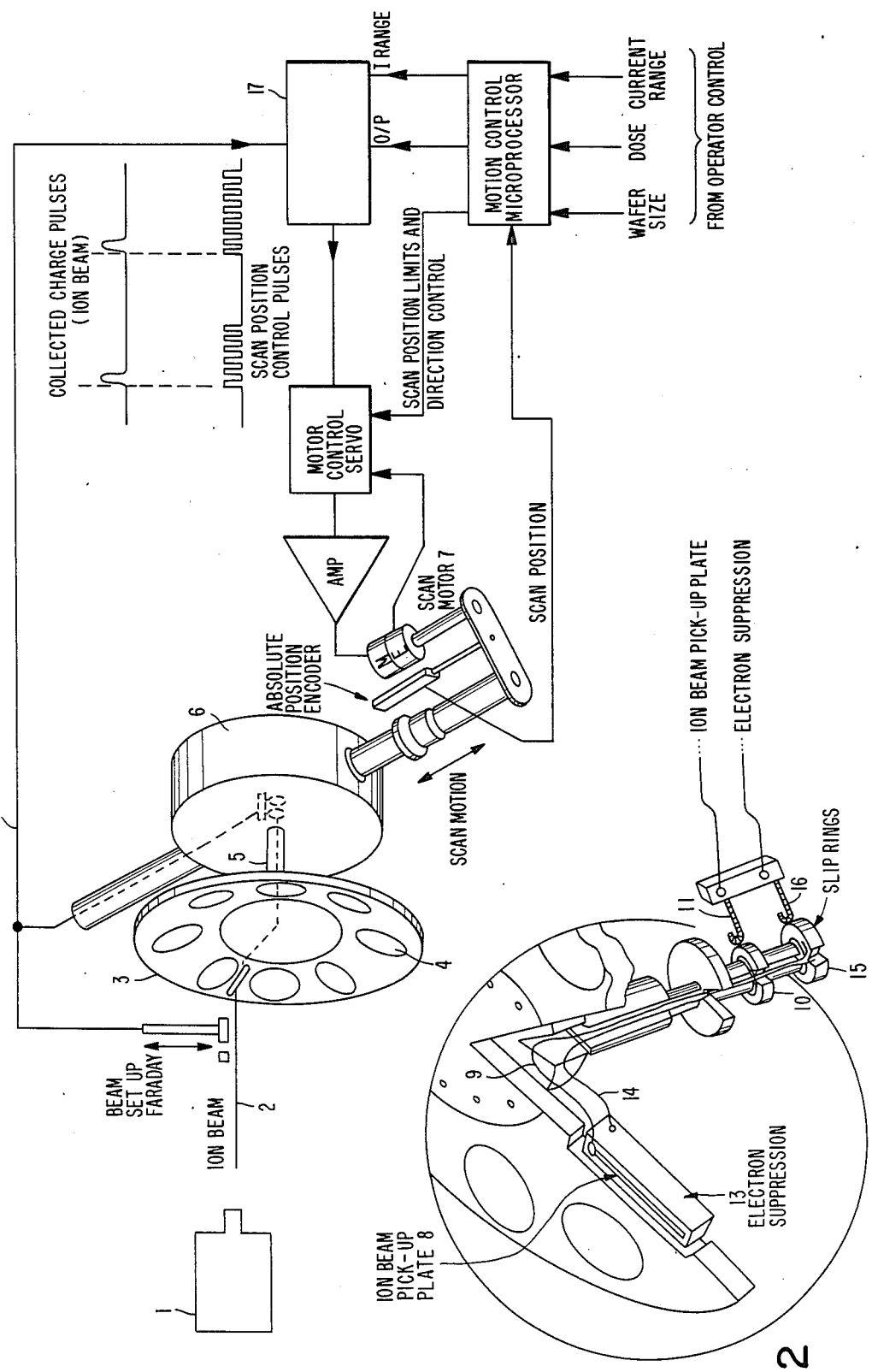
FIG. 1 is a somewhat diagrammatic isometric view of the apparatus of the present invention together with a simplified circuit diagram of certain circuitry used therewith.
FIG. 2 is a detail of a portion of the apparatus of FIG. 1.

Referring to the drawings, and first to FIGS. 1 and 2 thereof, therein is shown ion implantation apparatus of the type shown, for example, in U.S. Pat. No. 4,234,797 to Ryding. Said apparatus includes means 1 for producing an ion beam 2 and a wafer support disk 3. A number of wafers 4 into which ions are to be implanted are supported upon the support disk 3. The support disk 3 is mounted upon a hollow shaft 5 to which rotary motion is imparted by a suitable spin motor 6. As a result of this rotary motion the wafers 4 are moved through the path of the ion beam 2 at relatively high speed. In addition, a scan motion is imparted to the spin motor 6 (and hence to the entire support disk assembly) by means of a scan motor 7. As a result of this scan motion the spinning support disk is moved through the ion beam at relatively low speed.

In accordance with the invention, an ion beam pick-up plate 8 is mounted on the spinning support disk 3 in order to measure the change which is delivered thereto during each revolution of the spinning support disk 3. The width of the plate is constant, so that the charge delivered to the plate during a revolution of the spinning support disk is an indication of the charge per unit area delivered to that part of the wafers which are also being irradiated during that particular revolution of the spinning support disk. As the translational movement (i.e. the scan motion) proceeds, the portion being irradiated varies in radial position on the spinning support disk.

In order to measure the charge collected by the pick-up plate 8, a plate wire 9 connected thereto is mounted on the spinning support disk, passing from the plate to the shaft 5, and then through the interior of the shaft 5 to a plate slip ring 10 mounted on the shaft 5. A suitable plate brush 11 contacting the plate slip ring 10 takes up the charge and delivers it to suitable measuring and control circuitry via a suitable lead 12.

Since the incoming ions eject secondary electrons from the plate, these must be returned to the plate in order to avoid erroneous measurement of beam charge. In the apparatus of FIGS. 1 and 2 this is accomplished by a suppressor electrode 13 which is mounted on the spinning support disk by means of insulating supports. A suppression wire 14 connected to the suppressor electrode 13 is mounted on the spinning support disk, passing from the suppressor electrode 13 to the shaft 5, and then through the interior of the shaft 5 to a suppression slip ring 15 mounted on the shaft 5. A suitable suppression brush 16 contacting the suppression slip ring 15 is connected to a voltage source (not shown) which maintains a suitable voltage, such as −300 volts, on the suppressor electrode 13 with respect to the pick-up plate 8.

Figure 3:
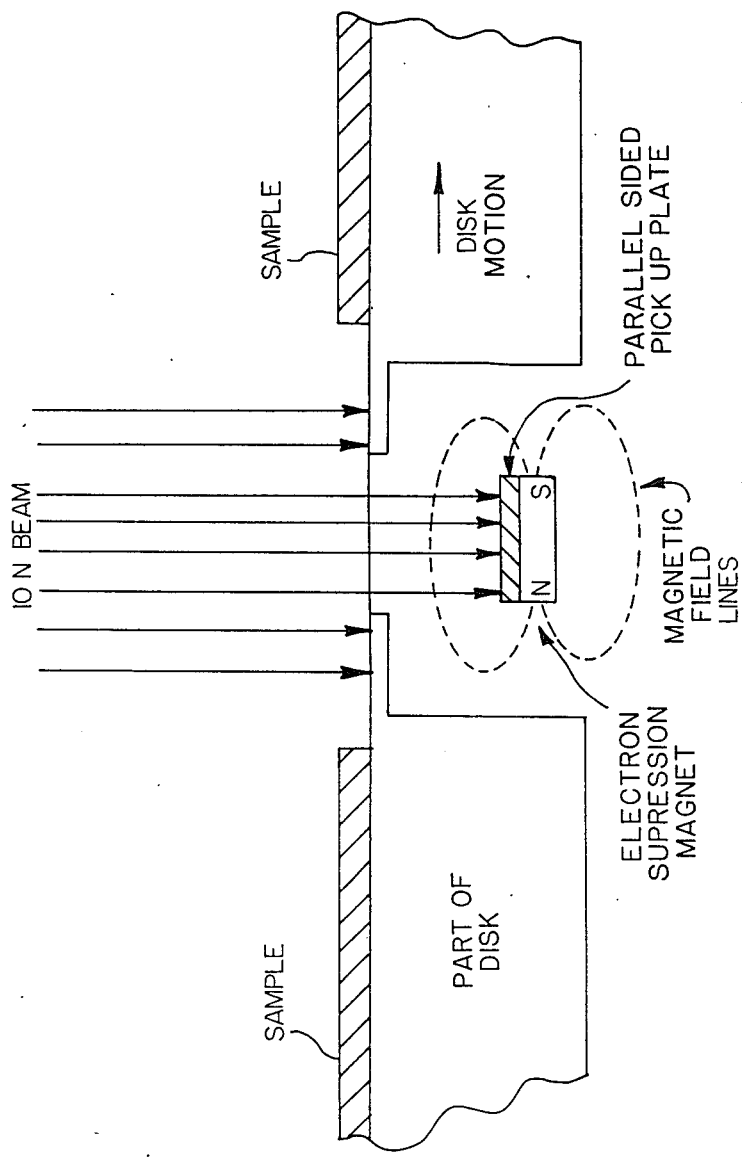
FIG. 3 is detailed view on an enlarged scale of a portion of the apparatus of FIG. 2, but showing an illustrative means for electron suppression.

Alternatively, magnetic means may be used to suppress secondary electrons. Such an arrangement is shown in FIG. 3. Referring thereto, there is affixed to the pick-up plate 8 a permanent magnet in the shape of a rectangle similar in dimensions to those of the pick-up plate 8 so that it forms a rectangle magnetized in such a way that the magnetic poles are along the two long sides of the rectangle, as shown in FIG. 3. The resultant magnetic field lines are such that electrons ejected from the pick-up plate 8 are deflected in circular paths perpendicular to the magnetic field lines so as to return to the pick-up plate 8 from which they originated. The magnetic field is of a strength sufficient to deflect low velocity, low mass electrons, and has negligible effect on the high energy high mass ions which are being implanted.

The charge received by the pick-up plate 8 is measured in the following manner. Each passage of the pick-up plate 8 through the ion beam 2 results in the deposit of a certain amount of charge on the pick-up plate 8. This charge has the form of a pulse, as shown in FIG. 1, and travels through lead 12 to the control circuitry, where it is converted to a series of pulses the number of which is proportional to the charge in the charge pulse. This is accomplished by use of an integrator 17 which collects the charge in the pulse received by the pick-up plate 8 and charges a capacitor in response thereto. This charged capacitor is then discharged in increments, thereby producing the series of control pulses hereinabove referred to. The timing of the circuitry is such that the capacitor is fully discharged before the next pulse appears at the pick-up plate 8. The series of control pulses is delivered to a servo mechanism for activating the scan motor 7 and moving the motor 6 and support disk assembly attached thereto by an amount of scan position proportional to the number of control pulses. All of this occurs before arrival of the next charge pulse at the pick-up plate 8. Thus, control of the scan position is achieved directly in increments proportional to the amount of charge received by the pick-up plate 8 during each revolution of the support disk 3. The circuitry does not involve measurement of the current in the ion beam 2, which can introduce errors.

Figures 1, 4:
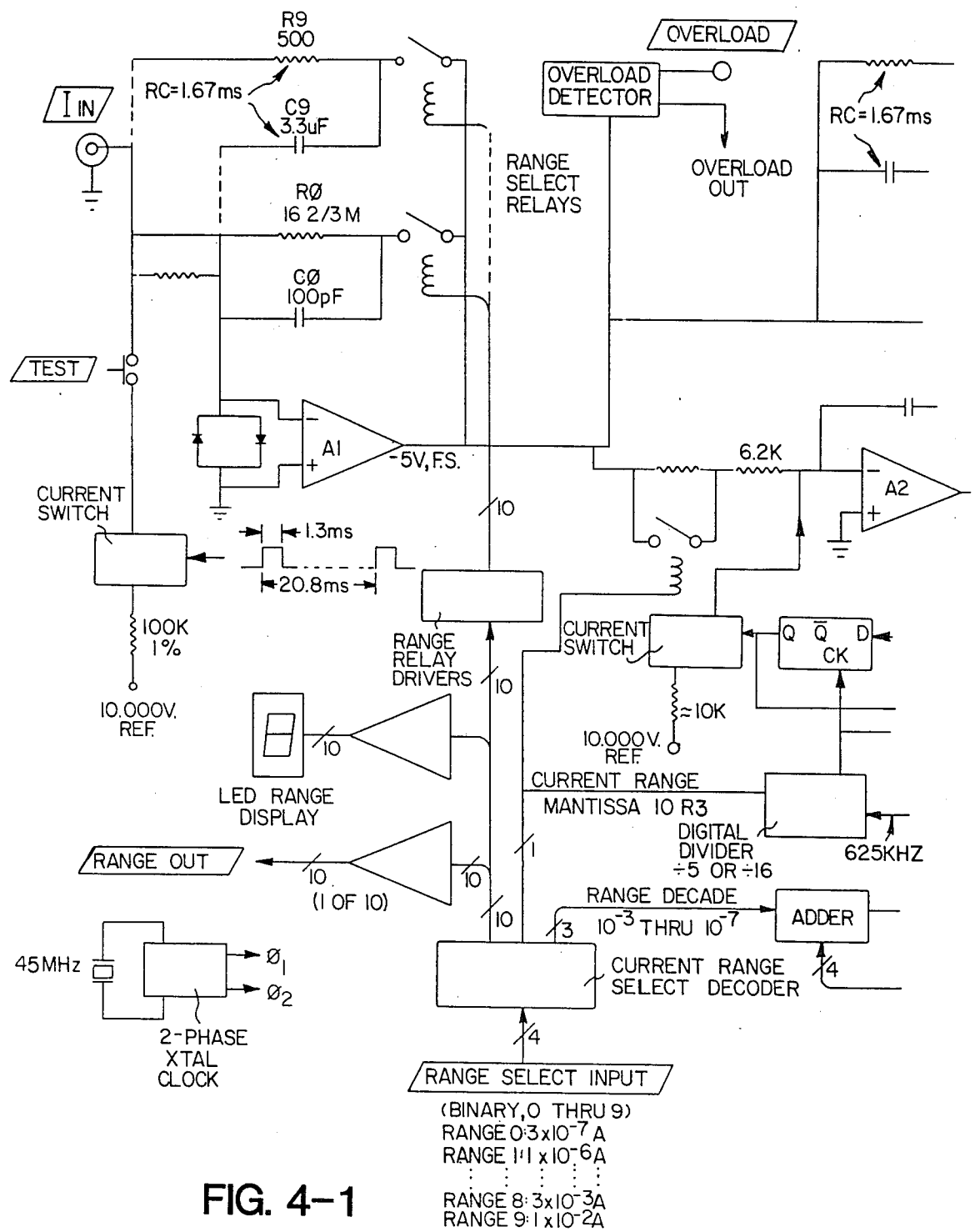
FIG. 4 is a circuit diagram of one of the component parts of the circuit diagram portion of FIG. 1.
Figures 2, 4:
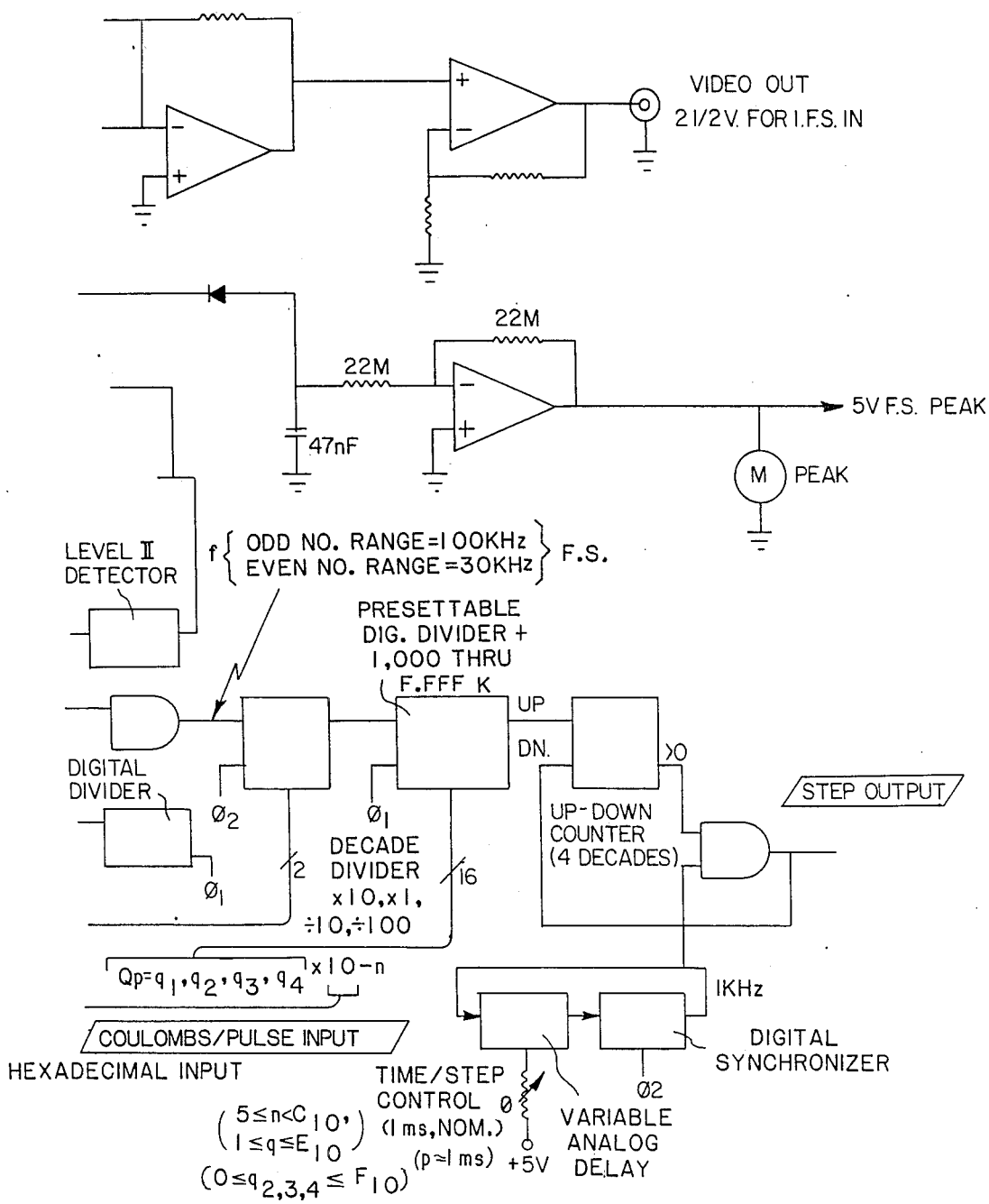

The details of the integrator 17 are shown in FIG. 4. Referring thereto, the ion beam pulse received by the ion beam pick-up plate 8 is delivered to an input terminal 18. It is then delivered via a resistor 19 having a resistance of a few hundred ohms to the inverting input terminal of an amplifier 20, which generates a negative voltage proportional to the incoming signal. This amplified signal charges a capacitor 21, and is also fed to the inverting input terminal of a second amplifier 22. The resulting output signal from amplifier 22 causes a Schmitt trigger 23 to enable a flip flop 24 to which appropriate clock pulses are applied. The output pulses from the flip flop 24 create an output of positive pulses from the current switch 25 which are fed to the inverting input terminal of the amplifier 22, and thus discharge the capacitor 21 in incremental steps. As this discharging of the capacitor 21 continues, the pulsed output from the flip flop 24 is also being applied to circuitry which generates control pulses at a step output 26.

Further details regarding circuitry of the type shown in FIG. 4 are disclosed in an article entitled "Concept, Operation and Performance of the Veeco VHC-120 High Current Ion Implanter" by Scaife, Wagner & Faul in Nuclear Instruments and Methods in Physics Research B6 (1985) 39–45, North Holland, Amsterdam.

Having thus described the principles of the invention, together with an illustrative embodiment thereof, it is to be understood that although specific terms are employed, they are used in a genetic and descriptive sense, and not for purposes of limitation, the scope of the invention being set forth in the following claims. In particular, the invention is not limited to use with a spinning support disk, but may be used with other types of moving support elements, such as those shown in U.S. Pat. No. 4,234,797 to Ryding.

We claim:

1. Apparatus for treating a workpiece by directing a beam at the workpiece, comprising in combination a moving support element for carrying said workpiece, first means for moving said support element in a first direction, second means for moving said support element in a second direction generally orthogonal to said first direction, a charge collector affixed to said moving support element, means for measuring the charge pulse received by said charge collector during each passage along said first direction through said beam, control means for varying the position of translation in said second direction, said charge collector comprising a plate extending generally along said second direction, and said control means comprising means for varying the position of translation in said second direction in dependent response to said charge received by said plate.

2. Apparatus according to claim 1, wherien said moving support element comprises a spinning disk.

3. Apparatus according to claim 1, wherein said apparatus includes means for suppressing secondary electrons ejected from said plate by said beam, in order to avoid erroneous measurement of beam charge.

* * * * *